US012772712B2

(12) United States Patent
Hai et al.

(10) Patent No.: US 12,772,712 B2
(45) Date of Patent: Oct. 20, 2026

(54) DISPLAY PANEL AND METHOD FOR MANUFACTURING SAME, METHOD AND APPARATUS FOR DETECTING INTENSITIES OF AMBIENT LIGHT

(71) Applicant: BOE Technology Group Co., Ltd., Beijing (CN)

(72) Inventors: Xiaoquan Hai, Beijing (CN); Yingzi Wang, Beijing (CN); Xue Dong, Beijing (CN); Lei Wang, Beijing (CN); Zheng Fang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 615 days.

(21) Appl. No.: 18/027,076

(22) PCT Filed: Mar. 22, 2022

(86) PCT No.: PCT/CN2022/082330
§ 371 (c)(1),
(2) Date: Mar. 17, 2023

(87) PCT Pub. No.: WO2023/178526
PCT Pub. Date: Sep. 28, 2023

(65) Prior Publication Data

US 2024/0334794 A1 Oct. 3, 2024

(51) Int. Cl.
*H10K 59/65* (2023.01)
*H10K 39/34* (2023.01)
*H10K 59/80* (2023.01)

(52) U.S. Cl.
CPC ......... *H10K 59/8792* (2023.02); *H10K 39/34* (2023.02); *H10K 59/65* (2023.02)

(58) Field of Classification Search
CPC ........ H10K 39/34; H10K 59/13; H10K 59/60; H10K 59/65; H10K 59/8792; G09G 3/3233; H10F 55/00
See application file for complete search history.

(56) References Cited

U.S. PATENT DOCUMENTS 8,269,753 B2 9/2012 Matsuki
8,309,901 B2 11/2012 Satoh et al.
(Continued)

FOREIGN PATENT DOCUMENTS

CN 107979698 A 5/2018
CN 111486950 A 8/2020
(Continued)

*Primary Examiner* — Eric K Ashbahian
(74) *Attorney, Agent, or Firm* — IPro, PLLC

(57) ABSTRACT

Provided is a display panel, including: an array substrate and a functional device layer disposed on a bearing surface of the array substrate and including a first photosensitive device, a second photosensitive device, and a plurality of light-emitting devices. The first photosensitive device is configured to detect light, emitted by the light-emitting device, reflected by a finger, and includes a first photosensitive layer, a first electrode, and a second electrode. The second photosensitive device is configured to detect an intensity of ambient light and includes a second photosensitive layer, a third electrode, and a fourth electrode. The second photosensitive layer and the first photosensitive layer are disposed in a same layer. The third electrode and the first electrode are disposed in a same layer. The fourth electrode and the second electrode are disposed in a same layer.

14 Claims, 11 Drawing Sheets

(56) References Cited

U.S. PATENT DOCUMENTS

| | | | | |
|---|---|---|---|---|
| 2016/0370231 | A1* | 12/2016 | Agahian | G09G 3/2003 |
| 2017/0374335 | A1* | 12/2017 | Hsu | H04N 23/74 |
| 2018/0365473 | A1 | 12/2018 | Wang et al. | |
| 2019/0386033 | A1 | 12/2019 | Li et al. | |
| 2020/0279086 | A1* | 9/2020 | Wang | H10K 59/65 |
| 2022/0171225 | A1* | 6/2022 | Wu | G06V 40/1318 |
| 2022/0181406 | A1* | 6/2022 | Seo | G06F 3/0443 |
| 2022/0271103 | A1 | 8/2022 | Hai et al. | |
| 2022/0415940 | A1 | 12/2022 | Jia et al. | |
| 2023/0122736 | A1* | 4/2023 | Kim | H10K 59/38<br>257/40 |

FOREIGN PATENT DOCUMENTS

| | | | |
|---|---|---|---|
| CN | 112418125 | A | 2/2021 |
| CN | 112861763 | A | 5/2021 |
| CN | 112985588 | A | 6/2021 |
| CN | 113224118 | A | 8/2021 |
| CN | 113836987 | A | 12/2021 |
| WO | 2018032878 | A1 | 2/2018 |

* cited by examiner

DISPLAY PANEL AND METHOD FOR MANUFACTURING SAME, METHOD AND APPARATUS FOR DETECTING INTENSITIES OF AMBIENT LIGHT

CROSS-REFERENCE TO RELATED APPLICATION

The present disclosure is a U.S. national stage of international application No. PCT/CN2022/082330, filed on Mar. 22, 2022, the content of which is herein incorporated by reference in its entirety.

TECHNICAL FIELD

The present disclosure relates to the field of display panels, and in particular, relates to a display panel and a display device.

BACKGROUND OF THE INVENTION

With the development of technology, electronic devices provide more and more functions. For example, for ease of unlocking of electronic devices, fingerprint unlocking technologies have been developed, and for enhancement of the display effect, electronic devices are capable of adjusting screens according to ambient light.

SUMMARY OF THE INVENTION

Embodiments of the present disclosure provide a display panel and a display device. The technical solutions are as follows.

According to one aspect of some embodiments of the present disclosure, a display panel is provided. The display panel includes an array substrate and a functional device layer, wherein the functional device layer is disposed on a bearing surface of the array substrate, and the functional device layer includes a first photosensitive device, a second photosensitive device, and a plurality of light-emitting devices; wherein

- the first photosensitive device is configured to detect light, emitted by the light-emitting device, reflected by a finger, and includes a first photosensitive layer, a first electrode, and a second electrode, the first electrode and the second electrode being respectively disposed on two opposite surfaces of the first photosensitive layer, and the first electrode being disposed on a surface, proximal to the array substrate, of the first photosensitive layer; and
- the second photosensitive device is configured to detect an intensity of ambient light and includes a second photosensitive layer, a third electrode, and a fourth electrode, the second photosensitive layer and the first photosensitive layer being disposed in a same layer, the third electrode and the first electrode being disposed in a same layer, and the fourth electrode and the second electrode being disposed in a same layer.

In some embodiments, the light-emitting device includes an anode, a light-emitting layer, and a cathode, wherein the anode and the cathode are respectively disposed on two opposite surfaces of the light-emitting layer, and the anode is disposed on a surface, proximal to the array substrate, of the light-emitting layer, the anode and the second electrode being disposed in a same layer.

In some embodiments, the display panel further includes a color filter layer, wherein the color filter layer is disposed on a surface, distal from the array substrate, of the functional device layer, and includes a plurality of color blocks and a light-shielding structure disposed between the plurality of color blocks, wherein the light-emitting device is opposite to the color block, and the light-shielding layer includes a fingerprint hole and an ambient light hole, the fingerprint hole being opposite to the first photosensitive layer, and the ambient light hole being opposite to the second photosensitive layer.

In some embodiments, a ratio of a width of the ambient light hole to a width of the second photosensitive layer ranges from 0.5 to 1.5, and both a width direction of the ambient light hole and a width direction of the second photosensitive layer are parallel to the bearing surface of the array substrate and lie in a reference plane, wherein the reference plane is a surface that is perpendicular to the bearing surface of the substrate and runs through a center of the ambient light hole.

In some embodiments, a center of one of the color blocks closest to the ambient light hole lies in a reference plane, and the ambient light hole (52*b*) and the one of the color blocks closest to the ambient light hole satisfy a relationship as follows:

- in the case that a width of the ambient light hole is greater than a width of the second photosensitive layer, $\tan\alpha=(P-d)/h$, and $\tan\beta=(P+d)/h$; and
- in the case that the width of the ambient light hole is not greater than the width of the second photosensitive layer, $\tan\alpha=(P-D)/h$, and $\tan\beta=(P+D)/h$;
- wherein P represents a distance, in a direction parallel to the bearing surface of the array substrate, between the center of the ambient light hole and a center of the one of the color blocks closest to the ambient light hole, and h represents a distance, in a direction perpendicular to the bearing surface of the array substrate, between the color block and the second photosensitive layer, and $0<\alpha<\beta\leq 42°$.

In some embodiments, the functional device layer further includes a color temperature sensor, wherein the color temperature sensor includes a third photosensitive device, a fourth photosensitive device, and a fifth photosensitive device;

- wherein the third photosensitive device, the fourth photosensitive device, and the fifth photosensitive device are respectively opposite to the color blocks of different colors.

In some embodiments, the third photosensitive device includes a third photosensitive layer, a fifth electrode, and a sixth electrode;

- the fourth photosensitive device includes a fourth photosensitive layer, a seventh electrode, and an eighth electrode; and
- the fifth photosensitive device includes a fifth photosensitive layer, a ninth electrode, and a tenth electrode; wherein
- the third photosensitive layer, the fourth photosensitive layer, the fifth photosensitive layer, and the first photosensitive layer are disposed in a same layer;
- the fifth electrode, the sixth electrode, the seventh electrode, and the first electrode are disposed in a same layer; and
- the sixth electrode, the eighth electrode, the tenth electrode, and the second electrode are disposed in a same layer.

In some embodiments, the array substrate includes a display region and a peripheral region surrounding the display region; wherein the light-emitting device and the first photosensitive device are disposed in the display region; and the second photosensitive device and the color temperature sensor are disposed in the display region or the peripheral region.

In some embodiments, the functional device layer further includes a transparent protective layer; wherein the transparent protective layer is disposed on surfaces, distal from the array substrate, of the first photosensitive layer, the second photosensitive layer, the third photosensitive layer, the fourth photosensitive layer, and the fifth photosensitive layer; and the transparent protective layer includes a plurality of vias, the second electrode, the fourth electrode, the sixth electrode, and the eighth electrode being respectively connected to the first photosensitive layer, the second photosensitive layer, the third photosensitive layer, the fourth photosensitive layer, and the fifth photosensitive layer via the vias.

According to another aspect of some embodiments of the present disclosure, a display device is provided. The display device includes the display panel as described above.

BRIEF DESCRIPTION OF DRAWINGS

For clearer descriptions of the technical solutions in the embodiments of the present disclosure, the following briefly introduces the accompanying drawings to be required in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

In some practices, fingerprint unlocking is achieved by deploying a fingerprint sensor in a display panel. The ambient light is detected by deploying an ambient light sensor under the display panel, such that the display panel is capable of adjusting the display effect according to the ambient light. However, the thickness of the electronic device of this structure is large.

The present disclosure is described in further detail with reference to the enclosed drawings, to clearly present the objects, technical solutions, and advantages of the present disclosure.

It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity, or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "connect," "contact," and the like are not intended to be limited to physical or mechanical connections, but may include electrical connections, either direct or indirect connection. The terms "on," "under," "left," and "right" are only used to indicate the relative positional relation. When the absolute position of the described object changes, the relative positional relation may change accordingly.

Figure 1:
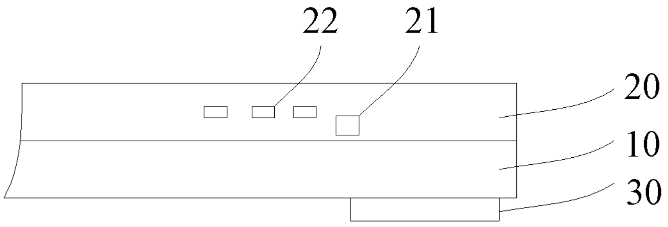
FIG. 1 is a schematic diagram of a partial structure of a display panel.

FIG. 1 is a schematic diagram of a partial structure of a display panel. As illustrated in FIG. 1, the display panel includes an array substrate 10, a functional device layer 20, and an ambient light sensor 30. The functional device layer 20 and the ambient light sensor 30 are disposed on two opposite surfaces of the array substrate 10. The functional device layer 20 includes a fingerprint sensor 21 and a plurality of light-emitting devices 22. The light-emitting device 22 is configured to emit light. Luminances and illumination colors of the plurality of light-emitting devices 22 cooperate with each other to form pictures. In the case that a finger is close to or presses on a surface of the display panel, light emitted by the light-emitting device 22 is reflected when irradiated onto the finger, and the fingerprint sensor 21 is capable of detecting the light reflected by the finger for fingerprint recognition. Ambient light is received by the ambient light sensor 30 through the functional device layer 20 and the array substrate 10, and the ambient light sensor 30 detects an intensity of ambient light based on the received ambient light.

To detect the intensity of ambient light, the ambient light sensor 30 is deployed on a bottom surface of the array substrate 10, such that an overall thickness of the display panel is large. In addition, in the case that the display panel is applied in a display device, such as a smartphone, structures, such as a flexible circuit board, need be arranged separately to connect the ambient light sensor 30 to a printed circuit board, which increases the cost and requires a larger space for arrangement.

Figure 2:
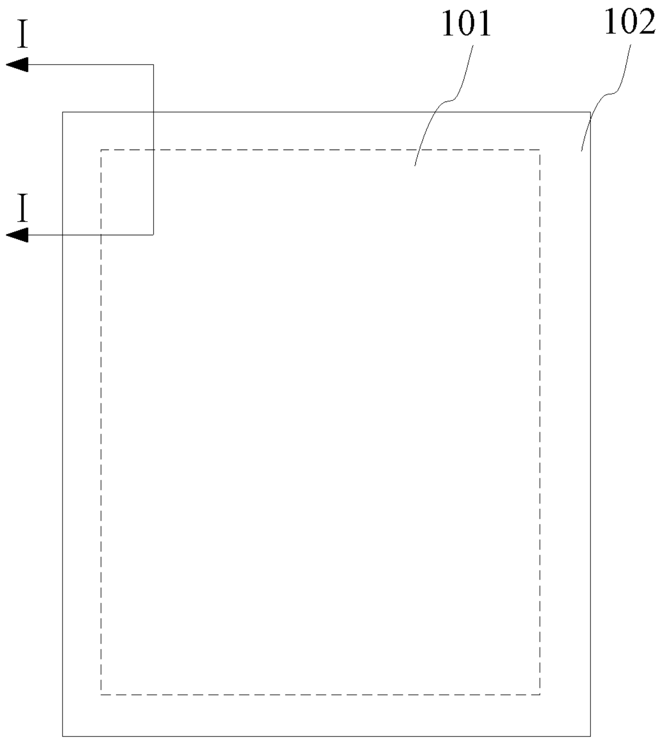
FIG. 2 is a top view of a display panel according to some embodiments of the present disclosure.
Figure 3:
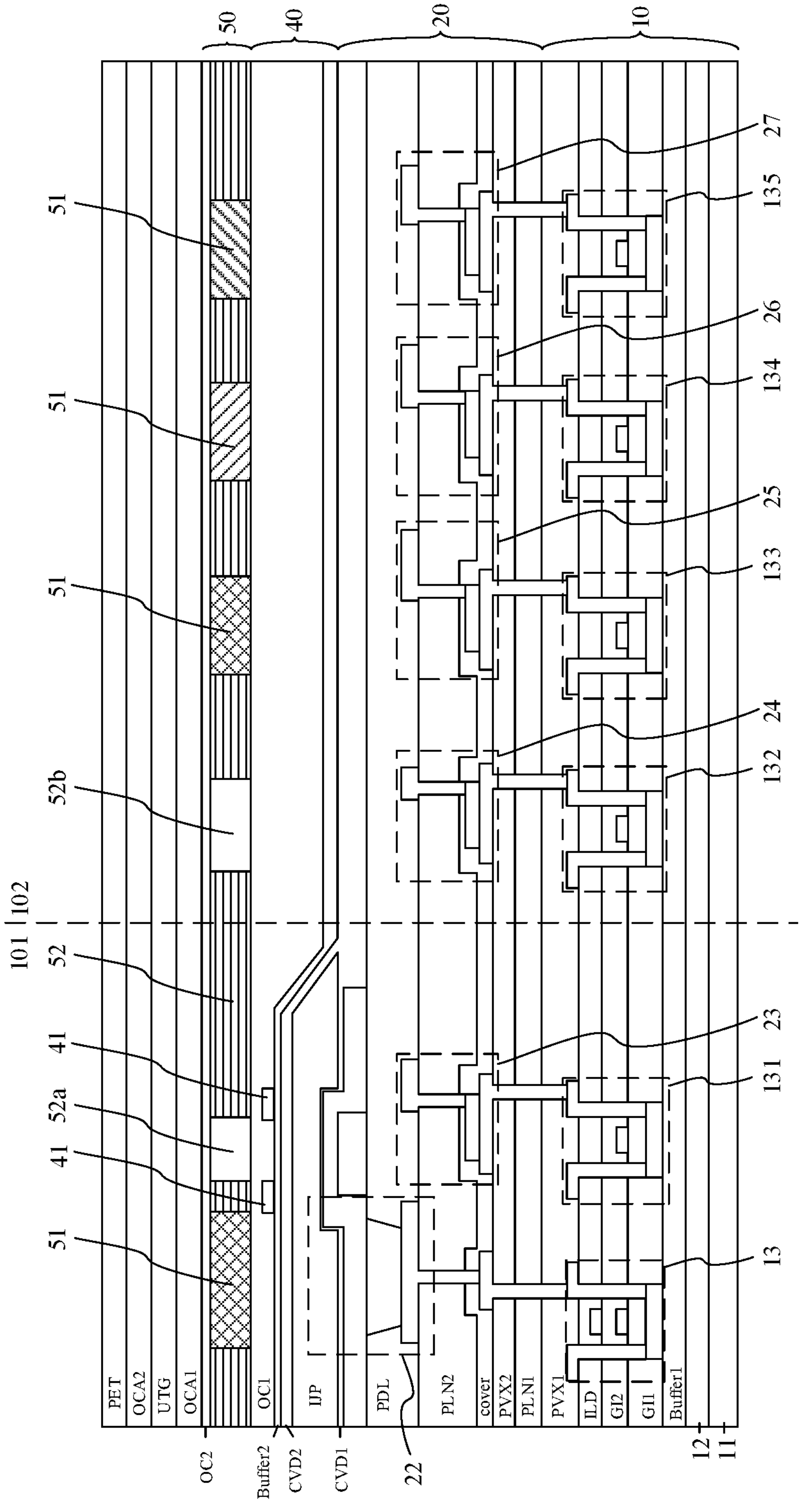
FIG. 3 is a sectional diagram along an I-I line of FIG. 2.

FIG. 2 is a top view of a display panel according to some embodiments of the present disclosure. FIG. 3 is a sectional diagram along an I-I line of FIG. 2. As illustrated in FIG. 3, the display panel includes an array substrate 10 and a functional device layer 20. The functional device layer 20 is disposed on a bearing surface of the array substrate 10. The bearing surface of the array substrate 10 is a surface, on which a plurality of thin-film transistors are disposed in arrays, of the array substrate 10.

The functional device layer 20 includes a first photosensitive device 23, a second photosensitive device 24, and a plurality of light-emitting devices 22.

Figure 4:
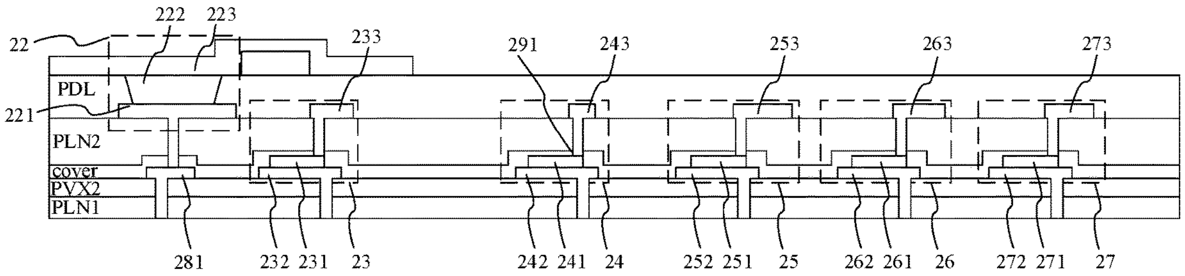
FIG. 4 is a schematic diagram of a partial structure of FIG. 3.

FIG. 4 is a schematic diagram of a partial structure of FIG. 3. As illustrated in FIG. 4, the first photosensitive device 23 is configured to detect light, emitted by the light-emitting device 22, reflected by a finger. The first photosensitive device 23 includes a first photosensitive layer 231, a first electrode 232, and a second electrode 233. The first electrode 232 and the second electrode 233 are disposed on two opposite surfaces of the first photosensitive layer 231. That is, the first photosensitive layer 231 is disposed between the first electrode 232 and the second electrode 233. In some examples, the surface of the first photosensitive layer 231 is in direct contact with the first electrode 232 and the second electrode 233. In other examples, the surface, between the first photosensitive layer 231 and the first electrode 232, of the first photosensitive layer 231 and the surface, between the first photosensitive layer 231 and the second electrode 233, of the first photosensitive layer 231 are provided with other structures. The first electrode 232 is disposed on a surface, proximal to the array substrate 10, of the first photosensitive layer 231.

The second photosensitive device 24 is configured to detect an intensity of ambient light. The second photosensitive device 24 includes a second photosensitive layer 241, a third electrode 242, and a fourth electrode 243. The second photosensitive layer 241 and the first photosensitive layer 231 are disposed in a same layer, the third electrode 242 and the first electrode 232 are disposed in a same layer, and the fourth electrode 243 and the second electrode 233 are disposed in a same layer.

The light, emitted by the light-emitting device 22, reflected by the finger is detected by the first photosensitive device 23 for fingerprint recognition, and the intensity of ambient light is detected by the second photosensitive device 24. By respectively arranging the first photosensitive layer 231, the first electrode 232, and the second electrode 233 of the first photosensitive device 23 and the second photosensitive layer 241, the third electrode 242, and the fourth electrode 243 of the second photosensitive device 24 in the same layer, an overall thickness of the display panel is reduced, compared with deploying the ambient light sensor underneath the display panel, that is, deploying the ambient light sensor on a surface, distal from the functional device layer 20, of the array substrate 10. Moreover, when arranged in the same layer, the structures in the same layer are manufactured together during a manufacturing process, such that the processes are simplified and the production cost is reduced. Furthermore, because the ambient light sensor is eliminated, structures such as a flexible circuit board are not required to be arranged to connect the ambient light sensor to a printed circuit board, such that the cost is reduced and the internal space of the display device is saved.

As illustrated in FIG. 3, the display panel further includes a color filter layer 50. The color filter layer 50 is disposed on a surface, distal from the array substrate 10, of the functional device layer 20. The color filter layer 50 includes a plurality of color blocks 51 arranged in arrays and a light-shielding structure 52 disposed between the plurality of color blocks 51. The light-emitting device 22 is opposite to the color block 51.

The plurality of color blocks 51 of different colors in the color filter layer 50 are distinguished by different fills in FIG. 3. The plurality of color blocks 51 of different colors include, for example, red blocks 51, green blocks 51, and blue blocks 51. Each of the light-emitting devices 22 is opposite to one of the color blocks 51. The term "opposite to" in the embodiments of the present disclosure means that orthographic projections of the two on the bearing surface of the array substrate 10 are at least partially overlapped with each other. For example, the light-emitting device 22 being opposite to the color block 51 means that an orthographic projection of the light-emitting device 22 on the bearing surface of the array substrate 10 is at least partially overlapped with an orthographic projection of the color block 51 on the bearing surface of the array substrate 10. The light emitted by the light-emitting device 22 is irradiated to the opposite color block 51 and transmitted through the opposite color block 51.

In some embodiments, the light-emitting device 22 is an organic light-emitting diode. The color of light emitted by the organic light-emitting diode and the color of the opposite color block 51 are the same.

As illustrated in FIG. 3, the functional device layer 20 further includes a color temperature sensor. The color temperature sensor includes a third photosensitive device 25, a fourth photosensitive device 26, and a fifth photosensitive device 27. The third photosensitive device 25, the fourth photosensitive device 26, and the fifth photosensitive device 27 are respectively opposite to the color blocks 51 of different colors. By arranging the color temperature sensor to detect the color temperature of the ambient light, the display panel is capable of adjusting the display effect according to the color temperature of the ambient light.

For example, the third photosensitive device 25 is opposite to the red color block 51, the fourth photosensitive device 26 is opposite to the green color block 51, and the fifth photosensitive device 27 is opposite to the blue color block 51. In the case that the ambient light is irradiated to the red color block 51, red light in the ambient light is transmitted through the red color block 51 and irradiated to the third photosensitive device 25, and the ambient light of other colors is absorbed by the red color block 51; in the case that the ambient light is irradiated to the green color block 51, green light in the ambient light is transmitted through the green color block 51 and irradiated to the fourth photosensitive device 26, and the ambient light of other colors is absorbed by the green color block 51; and in the case that the ambient light is irradiated to the blue color block 51, blue light in the ambient light is transmitted through the blue color block 51 and irradiated to the fifth photosensitive device 27, and the ambient light of other colors is absorbed by the blue color block 51.

The red light, the green light, and the blue light in the ambient light are respectively detected by the third photosensitive device 25, the fourth photosensitive device 26, and the fifth photosensitive device 27, and the color temperature is determined based on a ratio of signal amounts of electrical signals generated by the third photosensitive device 25, the fourth photosensitive device 26, and the fifth photosensitive device 27. The ratio of the signal amounts of the electrical signals generated by the third photosensitive device 25, the fourth photosensitive device 26, and the fifth photosensitive device 27 is equal to a ratio of tristimulus values. The tristimulus values are also referred to as trichrome values. The tristimulus values include a red primary color stimulus value, a green primary color stimulus value, and a blue primary color stimulus value, which are successively noted as X, Y, and Z. The chromaticity coordinates (x, y) are determined based on the tristimulus value. For example, the chromaticity coordinates are determined according to the following equations:

$$x=X/(X+Y+Z) \quad (1)$$

$$y=Y/(X+Y+Z) \quad (2)$$

Therefore, the color temperature is also determined based on the ratio of the signal amounts of the electrical signals generated by the third photosensitive device 25, the fourth photosensitive device 26, and the fifth photosensitive device 27.

The color temperature is then determined based on the chromaticity coordinates. For example, the color temperature is determined according to the following equations:

$$CCT=437n^3+3601n^2+6831n+5517 \quad (1)$$

$$n=(x-0.3320)/(0.1858-y) \quad (2)$$

CCT therein represents the color temperature.

The color temperature sensor is deployed close to the second photosensitive device 24. Because regions, where the second photosensitive device 24 and the color temperature sensor are disposed in the display panel, are not provided with the light-emitting devices, that is, the regions do not display pictures, the color temperature sensor and the second photosensitive device 24 are prevented from affecting the displays of other regions by deploying the color temperature sensor and the second photosensitive device 24 together, which is beneficial to the integrity of the displays of the display panel.

As illustrated in FIG. 4, the third photosensitive device 25 includes a third photosensitive layer 251, a fifth electrode 252, and a sixth electrode 253. The fourth photosensitive device 26 includes a fourth photosensitive layer 261, a seventh electrode 262, and an eighth electrode 263. The fifth photosensitive device 27 includes a fifth photosensitive layer 271, a ninth electrode 272, and a tenth electrode 273.

The third photosensitive layer 251, the fourth photosensitive layer 261, the fifth photosensitive layer 271, and the first photosensitive layer 231 are disposed in the same layer. The fifth electrode 252, the seventh electrode 262, the ninth electrode 272, and the first electrode 232 are disposed in the same layer. The sixth electrode 253, the eighth electrode 263, the tenth electrode 273, and the second electrode 233 are disposed in the same layer.

By arranging a portion of structures, in the first photosensitive device 23, the second photosensitive device 24, the third photosensitive device 25, the fourth photosensitive device 26, and the fifth photosensitive device 27, in the same layer, the thickness of the display panel is not increased as a result of the arrangement of the color temperature sensor.

As illustrated in FIG. 3, the light-shielding structure 52 further includes a fingerprint hole 52*a* and an ambient light hole 52*b*. Referring to FIG. 3 and FIG. 4, the first photosensitive layer 231 is opposite to the fingerprint hole 52*a* and the second photosensitive layer 241 is opposite to the ambient light hole 52*b*.

Because the first photosensitive layer 231 is opposite to the fingerprint hole 52*a*, the light emitted by the light-emitting device 22 reflected by the finger is irradiated to the first photosensitive layer 231 via the fingerprint hole 52*a*, such that the light emitted by the light-emitting device 22 reflected by the finger is detected by the first photosensitive device 23.

Because the second photosensitive layer 241 is opposite to the ambient light hole 52*b*, the ambient light is irradiated to the second photosensitive layer 241 via the ambient light hole 52*b*, such that the ambient light is detected by the second photosensitive device 24.

Figure 5:
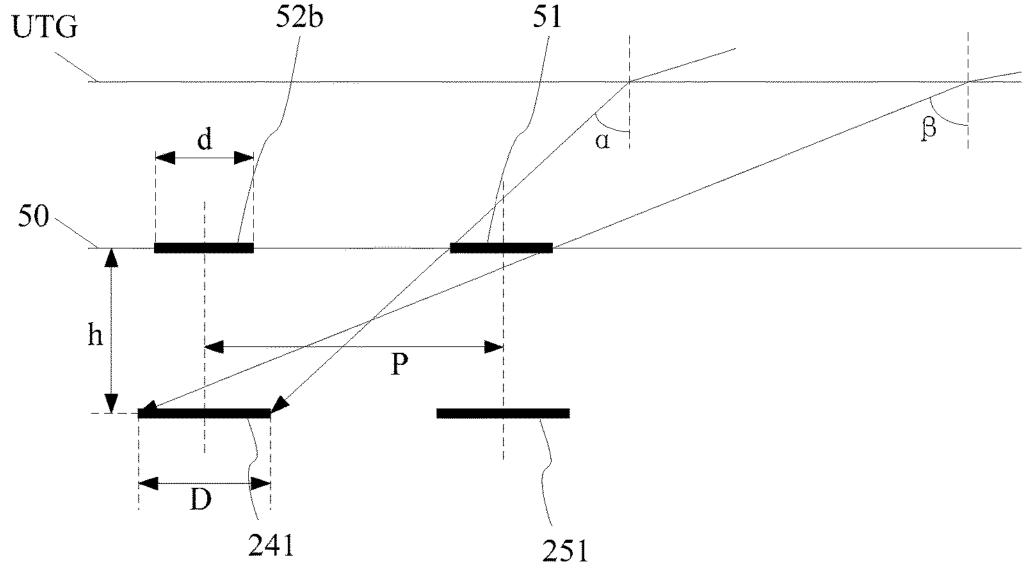
FIG. 5 is a schematic diagram of cooperation between a second photosensitive layer and a color filter layer according to some embodiments of the present disclosure.

FIG. 5 is a schematic diagram of cooperation between a second photosensitive layer and a color filter layer according to some embodiments of the present disclosure. As illustrated in FIG. 5, a ratio of a width d of the ambient light hole 52*b* to a width D of the second photosensitive layer 241 ranges from 0.5 to 1.5. Both a width direction of the ambient light hole 52*b* and a width direction of the second photosensitive layer 241 are parallel to the bearing surface of the array substrate 10 and lie in a reference plane. The reference plane referred to herein is a surface that is perpendicular to the bearing surface of the array substrate 10 and runs through a center of the ambient light hole 52*b*. FIG. 3 and FIG. 5 illustrate the sections sectioned by the reference plane. The center of the ambient light hole 52*b* is a straight line running through a geometric center of the ambient light hole 52*b* and perpendicular to a surface, proximal to or distal from the functional device layer 20, of the color filter layer 50.

For example, in the case that the ambient light hole 52*b* is circular, the center of the ambient light hole 52*b* is a straight line running through a center of circle of the ambient light hole 52*b* and perpendicular to the surface, proximal to or distal from the functional device layer 20, of the color filter layer 50. In some examples, the ambient light hole 52*b* is rectangular. Herein, the circular hole is used as an example.

By controlling the ratio of the width of the ambient light hole 52*b* to the width of the second photosensitive layer 241, the second photosensitive layer 241 is capable of receiving sufficient light, and other undesirable effects are avoided by preventing the ambient light hole 52*b* from being arranged too large, such as light leakage that the light emitted by the light-emitting device 22 obliquely exits from the ambient light hole 52*b* to the outside of the display panel.

Exemplarily, the width D of the second photosensitive layer 241 ranges from 5 μm to 80 μm.

The second photosensitive device 24, the third photosensitive device 25, the fourth photosensitive device 26, and the photosensitive device 27 are configured to receive the ambient light. The ambient light hole 52*b*, the color block 51 opposite to the third photosensitive layer 251, the color block 51 opposite to the fourth photosensitive layer 261, and the color block 51 opposite to the fifth photosensitive layer 271 are configured to transmit the ambient light. For the second photosensitive device 24, the third photosensitive device 25, the fourth photosensitive device 26, and the fifth photosensitive device 27 to receive sufficient light, and to avoid light leakage, the widths of the second photosensitive layer 241, the third photosensitive layer 251, the fourth photosensitive layer 261, and the fifth photosensitive layer 271 are equal, and the widths of the ambient light hole 52*b*, the color block 51 opposite to the third photosensitive layer 251, the color block 51 opposite to the fourth photosensitive layer 261, and the color block 51 opposite to the fifth photosensitive layer 271 are equal. The width of the color block 51 opposite to the light-emitting device 22 is equal to the width of the ambient light hole 52*b*. In this way, all of the color blocks 51 are equal in size, which facilitates the manufacture of the color filter layer 50.

FIG. 5 illustrates the section sectioned by the reference plane. The center of the color block 51 closest to the ambient light hole 52*b* is in the reference plane. In some embodiments of the present disclosure, the color block 51 closest to the ambient light hole 52*b* is the color block 51 opposite to the third photosensitive layer 251.

In some examples, the width d of the ambient light hole 52*b* is not greater than the width D of the second photosensitive layer 241, and the ambient light hole 52*b* and the color block 51 closest to the ambient light hole 52*b* satisfy the following equations:

$$\tan\alpha = (P - D)/h \quad (5)$$

$$\tan\beta = (P + D)/h \quad (6)$$

P represents a distance, in a direction parallel to the bearing surface of the array substrate 10, between the center of the ambient light hole 52*b* and the color block 51 closest to the ambient light hole 52*b*, and h represents a distance, in a direction perpendicular to the bearing surface of the array substrate 10, between the color block 51 and the second photosensitive layer 241, and $0<\alpha<\beta\leq 42°$, wherein both α and β represent refraction angles of the ambient light irradiating to the display panel when refracted to the inside of the display panel.

In other examples, the width d of the ambient light hole 52*b* is greater than the width D of the second photosensitive layer 241, and the ambient light hole 52*b* and the color block 51 closest to the ambient light hole 52*b* satisfy the following equations:

$$\tan\alpha = (P - d)/h \quad (7)$$

$$\tan\beta = (P + d)/h \quad (8)$$

$$0 < \alpha < \beta \leq 42°.$$

By defining the distance P, the distance h, the width d, and width D to satisfy the above equations, the light transmitted by the color block 51 is prevented from irradiating to the second photosensitive layer 241 and affecting an accuracy of the detection of the second photosensitive device 24. Similarly, the light transmitted by the ambient light hole 52*b* is prevented from being irradiated to the third photosensitive layer 251 and from affecting an accuracy of the detection of the third photosensitive device 25.

As illustrated in FIG. 2, the array substrate 10 includes a display region 101 and a peripheral region 102 surrounding the display region 101. The light-emitting device 22 and the first photosensitive device 23 are disposed in the display region 101.

The light-emitting device 22 is arranged in the display region 101 for displaying pictures, and the first photosensitive device 23 is arranged in the display region 101, such that a distance between the first photosensitive device 23 and the light-emitting device 22 is small. Therefore, when the user presses the display region 101 with the finger, the light emitted by the light-emitting device 22 is reflected by the finger and irradiated to the first photosensitive device 23 via the fingerprint hole 52*a*.

Exemplarily, the number of first photosensitive devices 23 is a plurality, and the plurality of first photosensitive devices 23 are disposed between the plurality of light-emitting devices 22 in the display region 101. The plurality of first photosensitive devices 23 are distributed within a large area, such that an area for fingerprint recognition is increased.

As illustrated in FIG. 4, the light-emitting device 22 includes an anode 221, a light-emitting layer 222, and a cathode 223. The anode 221 and the cathode 223 are disposed on two opposite surfaces of the light-emitting layer 222, and the anode 221 is disposed on a surface, proximal to the array substrate 10, of the light-emitting layer 222. The anode 221 and the second electrode 233 are disposed in the same layer.

The thickness of the display panel is further reduced by arranging the anode 221 of the light-emitting device 22 and the second electrode 233 of the first photosensitive device 23 in the same layer. Moreover, the anode 221 and the second electrode 233 are manufactured together when arranged in the same layer, such that the processes are simplified and the production cost is reduced.

Figure 6:
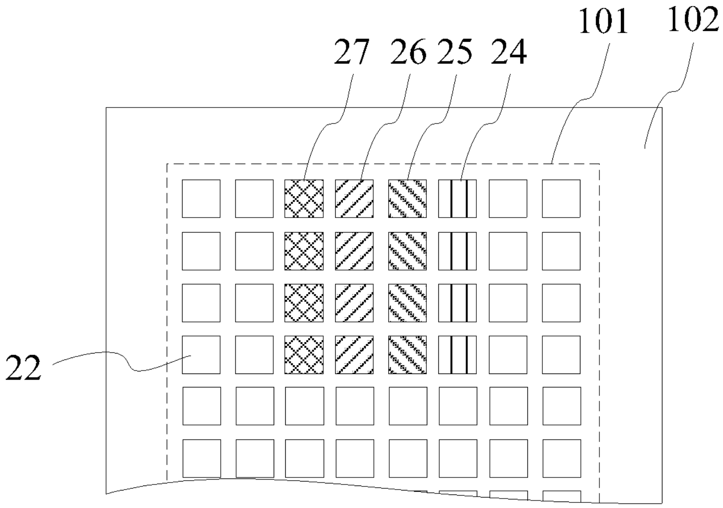
FIG. 6 is a schematic diagram of a partial structure of a display panel according to some embodiments of the present disclosure.

FIG. 6 is a schematic diagram of a partial structure of a display panel according to some embodiments of the present disclosure. As illustrated in FIG. 6, in some examples, both the second photosensitive device 24 and the color temperature sensor are disposed in the display region 101.

In the display device, the display region 101 is not shielded by a frame. By arranging the second photosensitive device 24 and the color temperature sensor in the display region 101, the second photosensitive device 24 and the color temperature sensor are prevented from being shielded by the frame, such that the detection of ambient light is not affected.

In the case that the second photosensitive device 24 and the color temperature sensor are arranged in the display region 101, they are arranged near a junction of the display region 101 and the peripheral region 102, such that the second photosensitive device 24 and the color temperature sensor are prevented from affecting the integrity of the displays.

One of the second photosensitive devices 24 and one of the color temperature sensors form a unit. The number of second photosensitive devices 24 and the number of color temperature sensors are multiple, and thus and the plurality of second photosensitive devices 24 and the plurality of color temperature sensors form a plurality of units.

In some examples, as illustrated in FIG. 6, the second photosensitive device 24, the third photosensitive device 25, the fourth photosensitive device 26, and the fifth photosensitive device 27 in a same unit are arranged in a row along the junction of the display region 101 and the peripheral region 102, and the plurality of units are arranged in a plurality of rows at a center of the junction.

Figure 7:
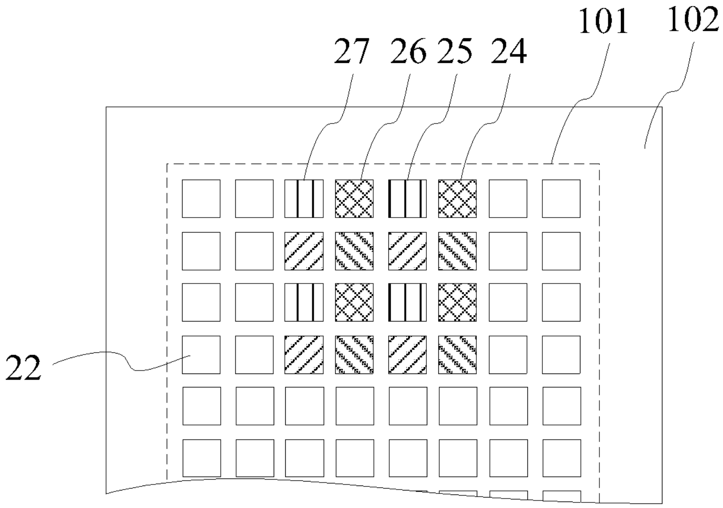
FIG. 7 is a schematic diagram of a partial structure of another display panel according to some embodiments of the present disclosure.

FIG. 7 is a schematic diagram of a partial structure of another display panel according to some embodiments of the present disclosure. In other examples, as illustrated in FIG. 7, the second and the fifth photosensitive device 27 in a same unit are arranged in two rows and two columns. The plurality of units are arranged along the junction of the display region 101 and the peripheral region 102, and the plurality of units are arranged in a plurality of rows and columns at the center of the junction.

In other examples, the second photosensitive device 24 and the color temperature sensor are both disposed in the peripheral region 102. For example, as illustrated in FIG. 3, the second photosensitive device 24, the third photosensitive device 25, the fourth photosensitive device 26, and the fifth photosensitive device 27 are disposed in the peripheral region 102.

By arranging both the second photosensitive device 24 and the color temperature sensor in the peripheral region, an area of the display region 101 for displays is larger. In the display device, the peripheral region 102 is typically shielded by the frame. In the case that the second photosensitive device 24 and the color temperature sensor are arranged in the peripheral region 102, the frame is provided with a light-transmitting region, such that the second photosensitive device 24 and the color temperature sensor are capable of receiving the ambient light normally.

As illustrated in FIG. 3, the array substrate includes a base substrate, a first buffer layer Buffer 1, a first gate insulative layer GI1, a second gate insulative layer GI2, an inter-level dielectric layer ILD, and a first insulative layer PVX1 that are successively stacked. The base substrate includes a backboard 11 and a flexible substrate 12. The array substrate 10 further includes a plurality of thin-film transistors 13 disposed on the first buffer layer Buffer1. In the plurality of thin-film transistors 13, a portion of the plurality of thin-film transistors 13 are connected to the light-emitting devices 22, and the thin-film transistors 13 connected to the light-emitting devices 22 are dual-gate thin-film transistors; and in other thin-film transistors 13, a first thin-film transistor 131 is connected to the first photosensitive device 23, a second thin-film transistor 132 is connected to the second photosensitive device 24, a third thin-film transistor 133 is connected to the third photosensitive device 25, a fourth thin-film transistor 134 is connected to the fourth photosensitive device 26, and a fifth thin-film transistor 135 is connected to the fifth photosensitive device 27.

The functional device layer 20 includes a first planarization layer PLN1, a second insulative layer PVX2, a transparent protective layer cover, a second planarization layer PLN2, a pixel definition layer PDL, a first inorganic package layer CVD1, an organic package layer IJP, and a second inorganic package layer CVD2 that are successively stacked. The functional device layer 20 further includes the light-emitting device 22, the first photosensitive device 23, the second and the fifth photosensitive device 27.

As illustrated in FIG. 4, the first electrode 232 of the first photosensitive device 23, the third electrode 242 of the second photosensitive device 24, the fifth electrode 252 of the third photosensitive device 25, the seventh electrode 262 of the fourth photosensitive device 26, and the ninth electrode 272 of the fifth photosensitive device 27 are disposed in the same layer and are disposed on the second insulative layer PVX2. The first electrode 232 of the first photosensitive device 23, the third electrode 242 of the second photosensitive device 24, the fifth electrode 252 of the third photosensitive device 25, the seventh electrode 262 of the fourth photosensitive device 26, and the ninth electrode 272 of the fifth photosensitive device 27 are respectively connected to a source electrode or a drain electrode of the corresponding thin-film transistor 13 in the array substrate 10 by the vias.

The second insulative layer PVX2 further includes a plurality of transition electrodes 281. The first electrode 232 of the first photosensitive device 23 and the transition electrode 281 are disposed in the same layer. The transition electrode 281 is configured to connect the light-emitting device 22 to the source electrode or the drain electrode of the thin-film transistor 13 corresponding to the light-emitting device 22 in the array substrate 10.

Figure 8:
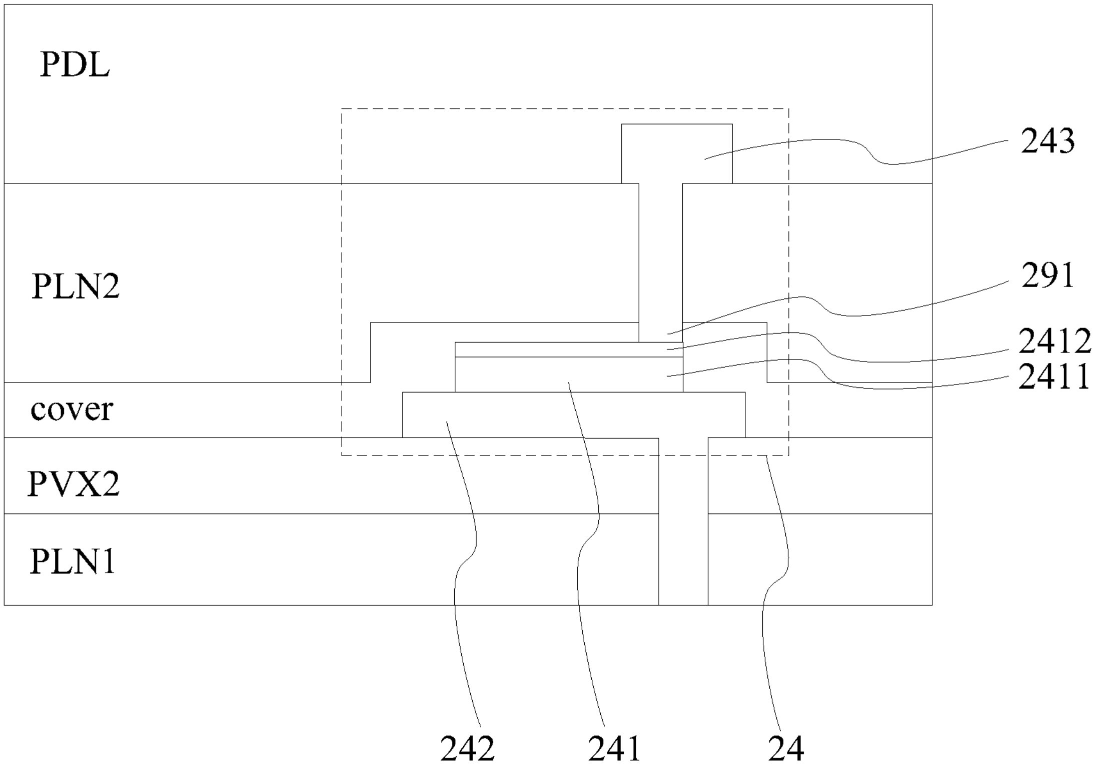
FIG. 8 is an enlarged schematic diagram of a first photosensitive device according to some embodiments of the present disclosure.

As illustrated in FIG. 4, the first photosensitive layer 231, the second photosensitive layer 241, the third photosensitive layer 251, the fourth photosensitive layer 261, and the fifth photosensitive layer 271 are respectively disposed on the first electrode 232, the second electrode 233, the third electrode 242, the fourth electrode 243, and the fifth electrode 252. Structures of the first photosensitive layer 231, the second photosensitive layer 241, the third photosensitive layer 251, the fourth photosensitive layer 261, and the fifth photosensitive layer 271 are the same. Exemplarily, FIG. 8 is an enlarged schematic diagram of a first photosensitive device according to some embodiments of the present disclosure. As illustrated in FIG. 8, the first photosensitive layer 231 includes a PIN photosensitive material layer 2411 disposed on the first electrode 232 and an indium tin oxide layer 2412 disposed on the PIN photosensitive material layer 2411. The PIN photosensitive material layer 2411 is a stacked structure including a P-type semiconductor, an intrinsic semiconductor, and an N-type semiconductor.

The transparent protective layer cover is disposed on a surface, distal from the array substrate 10, of the first photosensitive layer 231, the second photosensitive layer 241, the third photosensitive layer 251, the fourth photosensitive layer 261, and the fifth photosensitive layer 271 to act as protection, such that the first photosensitive layer 231, the second photosensitive layer 241, the third photosensitive layer 251, the fourth photosensitive layer 261, and the fifth photosensitive layer 271 are prevented from being damaged during a process of manufacturing subsequent structures.

As illustrated in FIG. 4, the second electrode 233 of the first photosensitive device 23, the fourth electrode 243 of the second photosensitive device 24, the sixth electrode 253 of the third photosensitive device 25, the eighth electrode 263 of the fourth photosensitive device 26, and the tenth electrode 273 of the fifth photosensitive device 27 are disposed in the same layer and are disposed on the second planarization layer PLN2. The transparent protective layer cover includes a plurality of vias 291. The second electrode 233, the fourth electrode 243, the sixth electrode 253, the eighth electrode 263, and the tenth electrode 273 are respectively connected to the first photosensitive layer 231, the second photosensitive layer 241, the third photosensitive layer 251, the fourth photosensitive layer 261, and the fifth photosensitive layer 271 via the vias 291.

The anode 221 of the light-emitting device 22 and the second electrode 233 are disposed in the same layer. The anode 21 is connected to the transition electrode 281 by the via 291.

As illustrated in FIG. 3, the light-emitting layer 222 of the light-emitting device 22 is disposed in a pixel aperture of the pixel definition layer PDL, and the cathode 223 of the light-emitting device 22 is disposed on the pixel definition layer PDL and is connected to the light-emitting layer 222.

The display panel further includes a touch layer 40. The touch layer 40 includes a second buffer layer Buffer 2, and a touch circuit 41 and a first overlay layer OC1 that are disposed on the second buffer layer Buffer 2. A thickness of a portion in the peripheral region 102 of the array substrate 10 of the first overlay layer OC1 is greater than a thickness of a portion in the display region 101, such that a surface, distal from the array substrate 10, of the first overlay layer OC1 is flat.

The color filter layer 50 includes the color block 51 and the light-shielding structure 52 that are disposed on the first overlay layer OC and a second overlay layer OC2 disposed on the color block 51 and the light-shielding structure 52.

The display panel further includes a first optical clear adhesive layer OCA1, an ultra thin glass (UTG), a second optical clear adhesive layer OCA2, and a cover plate PET that are disposed on the second overlay layer OC2. The ultra thin glass UTG is adhered to the color filter layer 50 by the first optical clear adhesive layer OCA1, and the cover plate PET is adhered to the ultra-thin glass UTG by the second optical clear adhesive layer OCA2.

The cover plate PET is made of a flexible material, such as polyethylene terephthalate.

Figure 9:
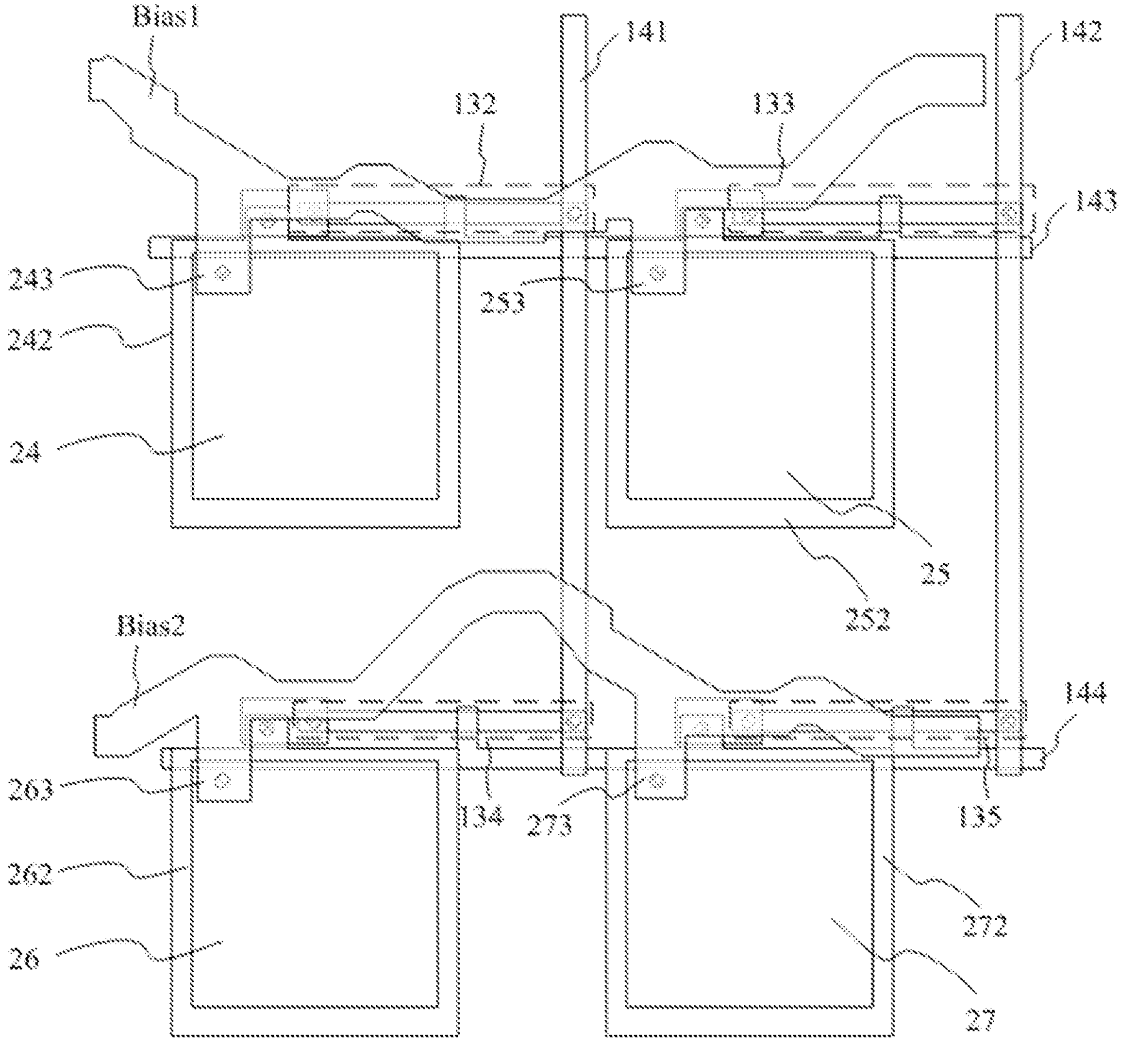
FIG. 9 is a schematic diagram of circuits of a second photosensitive device and a color temperature sensor according to some embodiments of the present disclosure.

FIG. 9 is a schematic diagram of circuits of a second photosensitive device and a color temperature sensor according to some embodiments of the present disclosure. As illustrated in FIG. 9, the second photosensitive device 24, the third photosensitive device 25, the fourth photosensitive device 26, and the fifth photosensitive device 27 are respectively connected to the second thin-film transistor 132, the third thin-film transistor 133, the fourth thin-film transistor 134, and the fifth thin-film transistor 135 in the plurality of thin-film transistors 13.

A first signal line 141, a second signal line 142, a first gate line 143, and a second gate line 144 are provided on the base substrate. The first signal line 141 and the second signal line 142 are parallel to each other, the first gate line 143 and the second gate line 144 are parallel to each other, and the first signal line 141 and the first gate line 143 are crossed and insulated from each other.

A first electrode of the second thin-film transistor 132 is connected to the first signal line 141, a second electrode of the second thin-film transistor 132 is connected to the third electrode 242 of the second photosensitive device 24, a gate electrode of the second thin-film transistor 132 is connected to the first gate line 143, and the fourth electrode 243 of the second photosensitive device 24 is connected to the first bias signal line Bias 1. The first bias signal line Bias 1 and the fourth electrode 243 of the second photosensitive device 24 are disposed in the same layer. One of the first electrodes and the second electrode is the source electrode, and the other is the drain electrode.

A first electrode of the third thin-film transistor 133 is connected to the second signal line 142, a second electrode of the third thin-film transistor 133 is connected to the fifth electrode 252 of the third photosensitive device 25, a gate electrode of the third thin-film transistor 133 is connected to the first gate line 143, and the sixth electrode 253 of the third photosensitive device 25 is connected to the first bias signal line Bias 1.

A first electrode of the fourth thin-film transistor 134 is connected to the first signal line 141, a second electrode of the fourth thin-film transistor 134 is connected to the seventh electrode 262 of the fourth photosensitive device 26, a gate electrode of the fourth thin-film transistor 134 is connected to the second gate line 144, and the eighth electrode 263 of the fourth photosensitive device 26 is connected to a second bias signal line Bias 2. The second bias signal line Bias 2 and the first bias signal line Bias 1 are disposed in the same layer.

A first electrode of the fifth thin-film transistor 135 is connected to the second signal line 142, a second electrode of the fifth thin-film transistor 135 is connected to the ninth electrode 272 of the fifth photosensitive device 27, a gate electrode of the fifth thin-film transistor 135 is connected to the second gate line 144, and the tenth electrode 273 of the fifth photosensitive device 27 is connected to the second bias signal line Bias 2.

The first signal line 141, the second signal line 142, the first gate line 143, the second gate line 144, the first bias signal line Bias 1, and the second bias signal line Bias 2 are connected to a drive chip IC, such as in some examples being connected to a drive chip for performing fingerprint recognition, that is, a drive chip is shared with the first photosensitive device 23. In other examples these are connected to an independent drive chip, this is, a driver chip is not shared with the first photosensitive device 23.

Some embodiments of the present disclosure further provide a display device. The display device includes the display panels as illustrated in any one of FIG. 2 to FIG. 9. The display device is, but is not limited to, a smartphone, a notebook computer, a tablet computer, a display, a navigator, and a digital camera. In the case of a smartphone, for example, the display device is a foldable touchscreen phone. \

Figure 10:
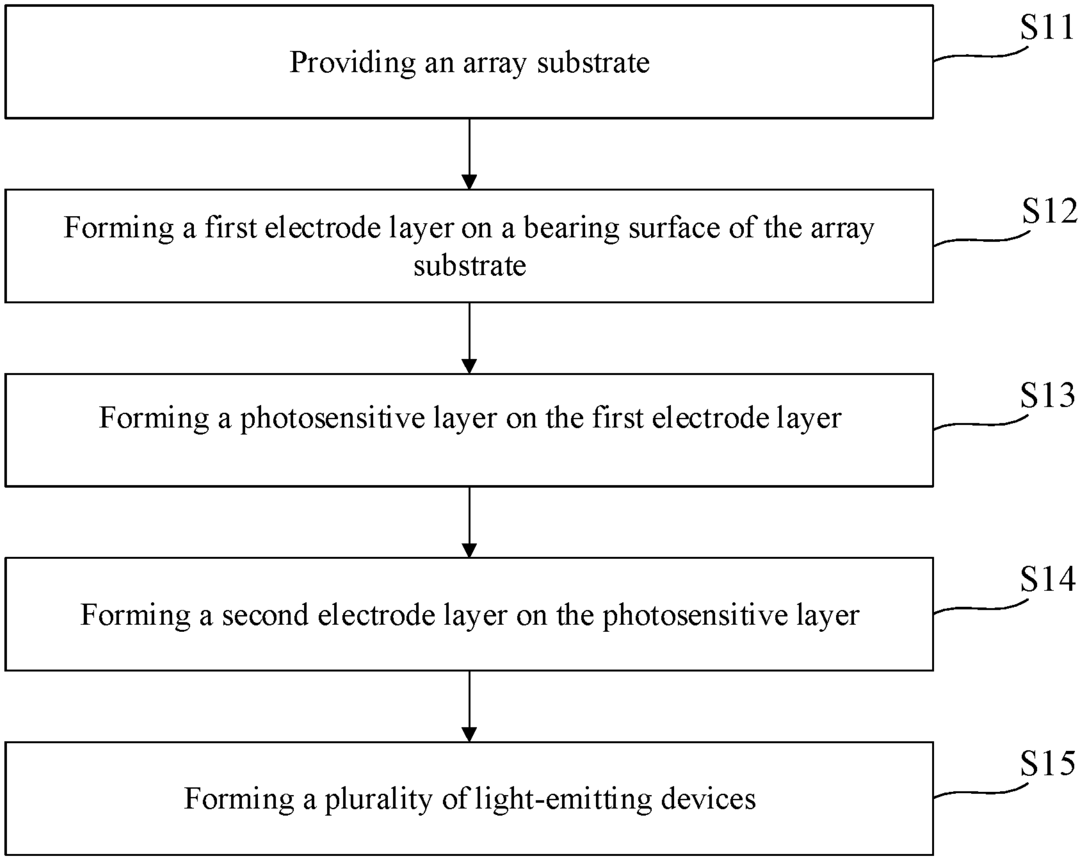
FIG. 10 is a flowchart of a method for manufacturing a display panel according to some embodiments of the present disclosure.
Figure 11:
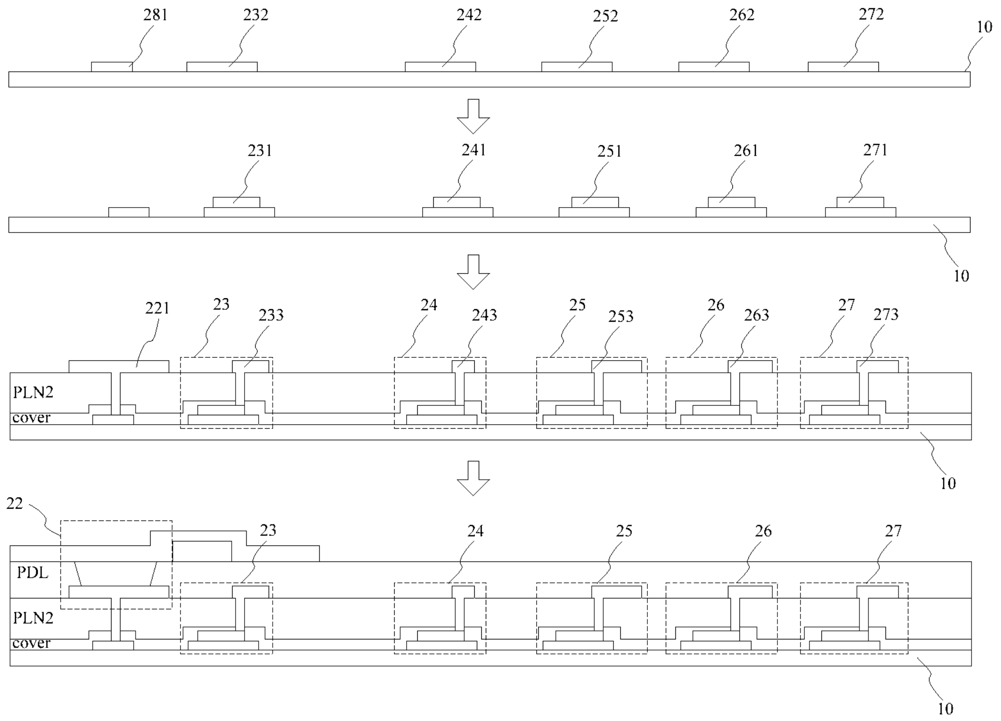
FIG. 11 is a schematic diagram of a process for manufacturing a display panel according to some embodiments of the present disclosure.

FIG. 10 is a flowchart of a method for manufacturing a display panel according to some embodiments of the present disclosure. The method applies to manufacturing the display panel as illustrated in any one of FIG. 2 to FIG. 9. FIG. 11 is a schematic diagram of a process for manufacturing a display panel according to some embodiments of the present disclosure. Referring to FIG. 10 and FIG. 11, the method includes the following steps.

In step S11, an array substrate 10 is provided.

In step S12, a first electrode layer is formed on a bearing surface of the array substrate 10.

The first electrode layer includes a first electrode 232 and a third electrode 242.

In step S13, a photosensitive layer is formed on the first electrode layer.

The photosensitive layer includes a first photosensitive layer 231 disposed on the first electrode 232 and a second photosensitive layer 241 disposed on the third electrode 242.

In step S14, a second electrode layer is formed on the photosensitive layer.

The second electrode layer includes a second electrode 233 disposed on the first photosensitive layer 231 and a fourth electrode 243 disposed on the second photosensitive layer 241, such that a first photosensitive device 23 and a second photosensitive device 24 are formed on the bearing surface of the array substrate 10.

In step S15, a plurality of light-emitting devices 22 are formed.

In this way, a functional device layer 20, including the first photosensitive device 23, the second photosensitive device 24, and the plurality of light-emitting devices 22, is formed on the bearing surface of the array substrate 10.

In the case that the display panel includes a color temperature sensor, in step S12, the formed first electrode layer further includes a fifth electrode 252, a seventh electrode 262, and a ninth electrode 272; and in step S13, the formed photosensitive layer further includes a third photosensitive layer 251, a fourth photosensitive layer 261, and a fifth photosensitive layer 271; and in step S14, the formed second electrode layer formed further includes a sixth electrode 253, an eighth electrode 263, and a tenth electrode 273. The second electrode layer further includes an anode 221 of the light-emitting device 22. That is, the anode 221 of the light-emitting device 22 and the second electrode 233 are disposed in a same layer.

By respectively arranging the first photosensitive layer 231, the first electrode 232, and the second electrode 233 of the first photosensitive device 23 and the second photosensitive layer 241, the third electrode 242, and the fourth electrode 243 of the second photosensitive device 24 in the same layer, an overall thickness of the display panel is reduced compared with deploying an ambient light sensor on a surface, distal from the functional device layer 20, of the array substrate 10. Moreover, the structures in the same layer are manufactured together during the manufacturing process when arranged in the same layer, such that the processes are simplified and the production cost is reduced. Furthermore, because the ambient light sensor is eliminated, structures such as a flexible circuit board are not required to be arranged to connect the ambient light sensor to a printed circuit board, such that the cost is reduced and the internal space of the display device is saved.

Figure 12:
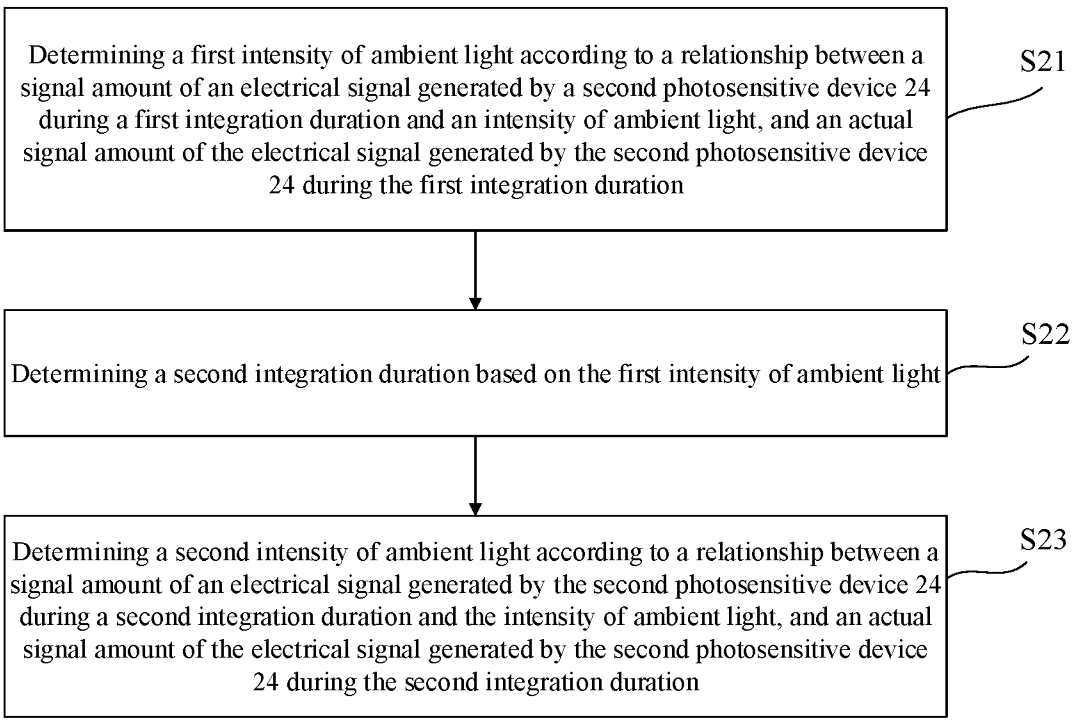
FIG. 12 is a flowchart of a method for detecting intensities of ambient light according to some embodiments of the present disclosure.

FIG. 12 is a flowchart of a method for detecting intensities of ambient light according to some embodiments of the present disclosure. The method applies to the display panel as illustrated in any one of FIG. 2 to FIG. 9. The method includes the following steps.

In step S21, a first intensity of ambient light is determined according to a relationship between a signal amount of an electrical signal generated by a second photosensitive device 24 during a first integration duration and an intensity of ambient light, and an actual signal amount of the electrical signal generated by the second photosensitive device 24 during the first integration duration.

In step S22, a second integration duration is determined based on the first intensity of ambient light The second integration duration is greater than the first integration duration.

In step S23, a second intensity of ambient light is determined according to a relationship between a signal amount of an electrical signal generated by the second photosensitive device 24 during a second integration duration and the intensity of ambient light, and an actual signal amount of the electrical signal generated by the second photosensitive device 24 during the second integration duration.

In the embodiments of the present disclosure, the intensity of ambient light is detected by performing two detections. In a first detection, the intensity of ambient light is initially determined based on the signal amount of the electrical signal generated during the first integration duration, and then the integration duration is adjusted, based on the detection result, to determine the second integration duration that is longer than the first integration duration. In a second detection, the second intensity of ambient light with higher accuracy is determined based on the signal amount of the electrical signal generated during the second integration duration. In this way, the accuracy of the detection of ambient light is improved.

Figure 13:
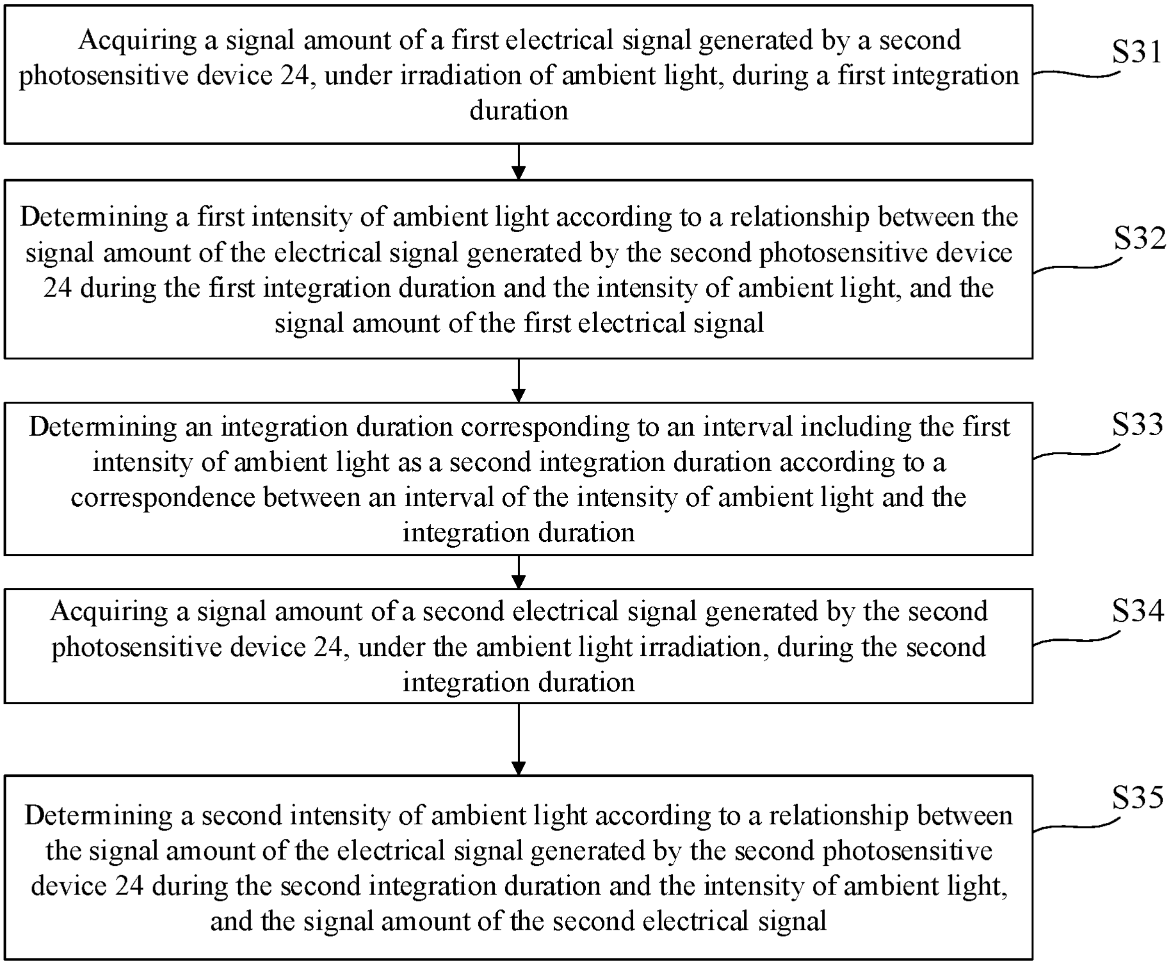
FIG. 13 is a flowchart of another method for detecting intensities of ambient light according to some embodiments of the present disclosure.

FIG. 13 is a flowchart of another method for detecting intensities of ambient light according to some embodiments of the present disclosure. The method applies to the display panel as illustrated in any one of FIG. 2 to FIG. 9. The method includes the following steps.

In step S31, a signal amount of a first electrical signal generated by a second photosensitive device 24, under irradiation of ambient light, during a first integration duration is acquired.

Exemplarily, the signal amount is the quantity of electric charge. During a same integration duration, the larger the signal amount of the electrical signal generated by the second photosensitive device 24, the stronger the ambient light. That is, in the case that the integration duration is determined, a correspondence is present between the signal amount of the generated electrical signal and an intensity of ambient light, and thus the intensity of ambient light is determined by detecting the signal amount of the electrical signal and combining the correspondence.

Under the same ambient light, the longer the integration duration, the larger the signal amount of the electrical signal generated by the second photosensitive device 24 during the integration duration. In the case that the detection of intensities of ambient light is performed during a longer integration duration, the signal amount of the electrical signal generated by the second photosensitive device 24 during the integration duration changes greatly even if the intensity of ambient light changes slightly. Therefore, the longer the integration duration, the higher the accuracy of the detection. However, the second photosensitive device 24 gradually saturates in a process of receiving light, and the signal amount of the electrical signal no longer increases upon reaching a maximum value. Therefore, the integration duration is longer, the second photosensitive device 24 is more prone to saturation, and the maximum intensity of ambient light that can be detected is smaller, which means a range of the detection is smaller.

Figure 14:
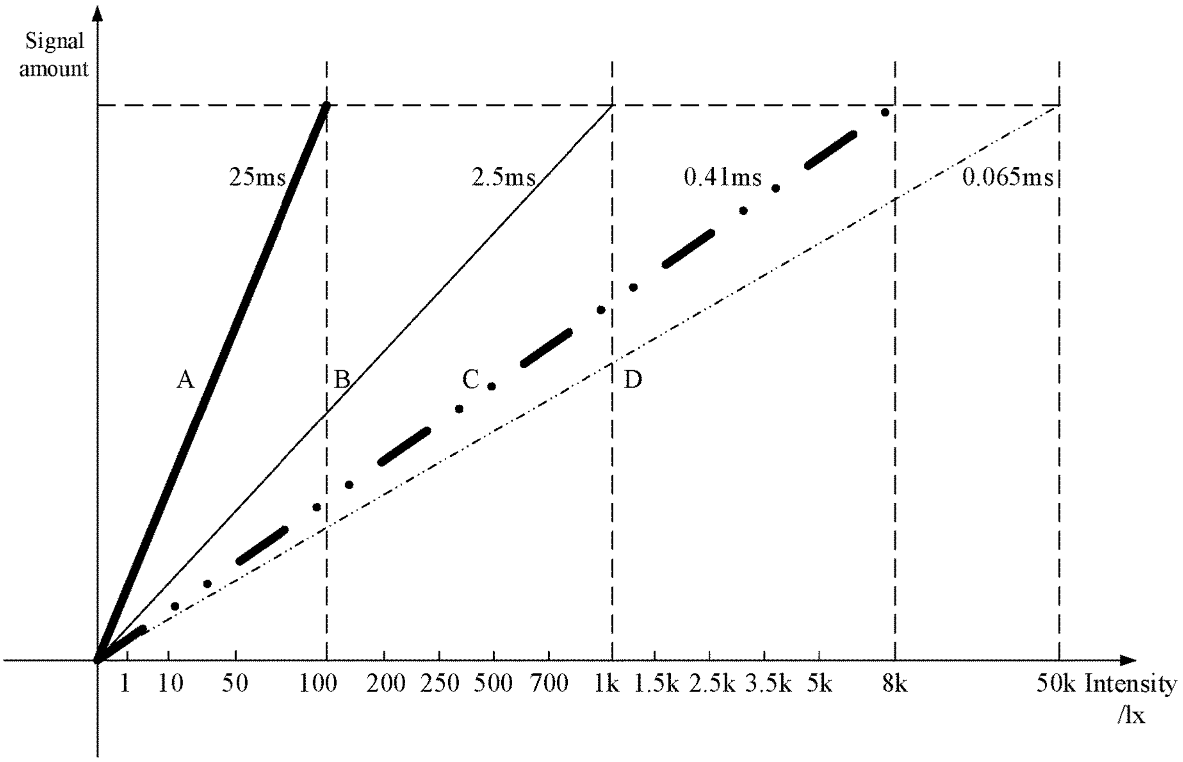
FIG. 14 is a relation curve of a signal amount of an electrical signal generated by a second photosensitive device and an intensity of ambient light according to some embodiments of the present disclosure.

For example, FIG. 14 is a relationship curve of a signal amount of an electrical signal generated by a second photosensitive device and an intensity of ambient light according to some embodiments of the present disclosure. As illustrated in FIG. 14, relationship curves of the signal amounts of the electrical signals generated by the second photosensitive device 24 during four different integration durations and the intensity of ambient light are illustrated in the form of examples in FIG. 14. The four relationship curves are respectively noted as a relationship curve A, a relationship curve B, a relationship curve C, and a relationship curve D. The first integration duration is a default integration duration when the detection of ambient light is performed in the display panel and may be a shortest of a variety of different integration durations, such as 0.065 ms. In the case that the first integration duration is employed, the range of the second photosensitive device 24 is the maximum.

In step S32, a first intensity of ambient light is determined according to a relationship between the signal amount of the electrical signal generated by the second photosensitive device 24 during the first integration duration and the intensity of ambient light, and the signal amount of the first electrical signal.

For example, the relationship between the signal amount of the electrical signal generated by the second photosensitive device 24 during the first integration duration and the intensity of ambient light is expressed by the relationship curve D in FIG. 14. The first intensity of ambient light is determined based on the signal amount of the first electrical signal and combined with the relationship curve D.

In step S33, an integration duration corresponding to an interval including the first intensity of ambient light is determined as a second integration duration according to a correspondence between an interval of the intensity of ambient light and the integration duration.

The interval of the intensity of ambient light is determined by a predefined plurality of different integration durations. For the plurality of integration durations from large to small, the second photosensitive device 24 has a plurality of ranges from small to large. A plurality of intervals are formed between 0 and the respective maximum measurement values of the plurality of ranges. For example, four integration durations from large to small illustrated in FIG. 14 correspond to four ranges, which are respectively 0 to 100 lx (lux), 0 to 1 klx (kilo lux), 0 to 8 klx, and 0 to 50 klx. The maximum measurement values of the four ranges are respectively 100 lx, 1 klx, 8 klx, and 50 klx. Four intervals of the intensity of ambient light are respectively formed by 0 and 100 lx, 1 klx, 8 klx, and 50 klx, and the four intervals of the intensity of ambient light are respectively: 0 to 100 lx, 100 lx to 1 klx, 1 klx to 8 klx, and 8 klx to 50 klx.

Assuming that the first intensity of ambient light is determined to be 500 lx in step S32, then the interval including the first intensity of ambient light is 100 lx to 1 klx, and the integration duration corresponding to the interval is 2.5 ms, such that the second integration duration is 2.5 ms.

In step S34, a signal amount of a second electrical signal generated by the second photosensitive device 24, under the ambient light irradiation, during the second integration duration is acquired In step S35, a second intensity of ambient light is determined according to a relationship between the signal amount of the electrical signal generated by the second photosensitive device 24 during the second integration duration and the intensity of ambient light, and the signal amount of the second electrical signal.

The second integration duration determined in step S33 is 2.5 ms, and thus the relationship between the signal amount of the electrical signal generated by the second photosensitive device 24 during the second integration duration and the intensity of ambient light is expressed as the relationship curve B in FIG. 14, such that the second intensity of ambient light is determined based on the signal amount of the second electrical signal determined in step S34 and the relationship curve B.

The range of the second photosensitive device 24 is 0 to 50 klx in the case that the integration duration is 0.065 ms, and the range of the second photosensitive device 24 is 0 to 1 klx in the case that the integration duration is 2.5 ms. Therefore, the detected intensity of ambient light is more accurate in the case that the integration duration is 2.5 ms.

The embodiments of the present disclosure give the description using a scenario where four intervals of the intensity of ambient light are predefined as an example. In other examples, more intervals of the intensity of ambient light are predefined to improve the accuracy of the detection, or fewer intervals of the intensity of ambient light are predefined to reduce the cost.

The display panel, upon the detection of the intensity of ambient light, adjusts a display luminance based on the detected intensity of ambient light. For example, a higher luminance is employed for displays in the case that the intensity of ambient light is great, and a lower luminance is employed for displays in the case that the intensity of ambient light is small, which means that the display luminance of the display panel increases with an enhancement of the ambient light. Adjustment accuracies of the display luminance are different according to different display panels to meet the requirements of different users. For example, the same luminance is employed for the display panel in the case that the intensity of ambient light is between 1 lx to 10 lx. That is, the luminance of the display panel is the same in the case that the intensity of ambient light is 5 lx and 8 lx. In some examples, in each of the intervals of the intensity of ambient light, four to five luminance is defined. For example, a same luminance is employed in the case that the intensity of ambient light is between 0 to 1 lx, a same luminance is employed in the case that the intensity of ambient light is between 1 lx to 10 lx, a same luminance is employed in the case that the intensity of ambient light is between 10 lx to 50 lx, and a same luminance is employed in the case that the intensity of ambient light is between 50 lx to 100 lx.

In the embodiments of the present disclosure, by testing the display panel with the structure illustrated in FIG. 3, the intervals of the intensity of ambient light are illustrated in FIG. 14. In the case that the second intensity of ambient light is determined respectively based on the relationship curve A, the relationship curve B, the relationship curve C, and the relationship curve D, signal-noise ratios are respectively 7.2, 2, 2.1, and 3.4, none of which is less than 2, and the resolution meets the requirements.

Figure 15:
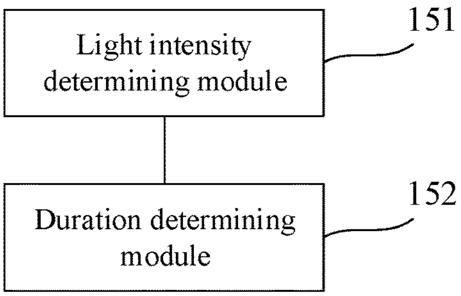
FIG. 15 is a structural block diagram of an apparatus for detecting intensities of ambient light according to some embodiments of the present disclosure.

FIG. 15 is a structural block diagram of an apparatus for detecting intensities of ambient light according to some embodiments of the present disclosure. As illustrated in FIG. 15, the apparatus includes a light intensity determining module 151 and a duration determining module 152. The light intensity determining module 151 is configured to determine a first intensity of ambient light based on a relationship between a signal amount of an electrical signal generated by a second photosensitive device 24 during a first integration duration and an intensity of ambient light, and an actual signal amount of the electrical signal generated by the second photosensitive device 24 during the first integration duration. The duration determining module 152 is configured to determine a second integration duration based on the first intensity of ambient light, wherein the second integration duration is greater than the first integration duration. The light intensity determining module 151 is further configured to determine a second intensity of ambient light based on a relationship between a signal amount of an electrical signal generated by the second photosensitive device 24 during the second integration duration and the intensity of ambient light, and an actual signal amount of the electrical signal generated by the second photosensitive device 24 during the second integration duration.

In some examples, the duration determining module 152 is configured to determine, based on a correspondence between an interval of the intensity of ambient light and an integration duration, an integration duration corresponding to an interval including the first intensity of ambient light as the second integration duration.

The apparatus for detecting intensities of ambient light is configured to perform the method for detecting intensities of ambient light illustrated in FIG. 12 or FIG. 13. The light intensity determining module 151 is configured to perform step S21 and step S23, or perform step S31, step S32, step S34, and step S35; and the duration determining module 152 is configured to perform step S22 or step S33.

Figure 16:
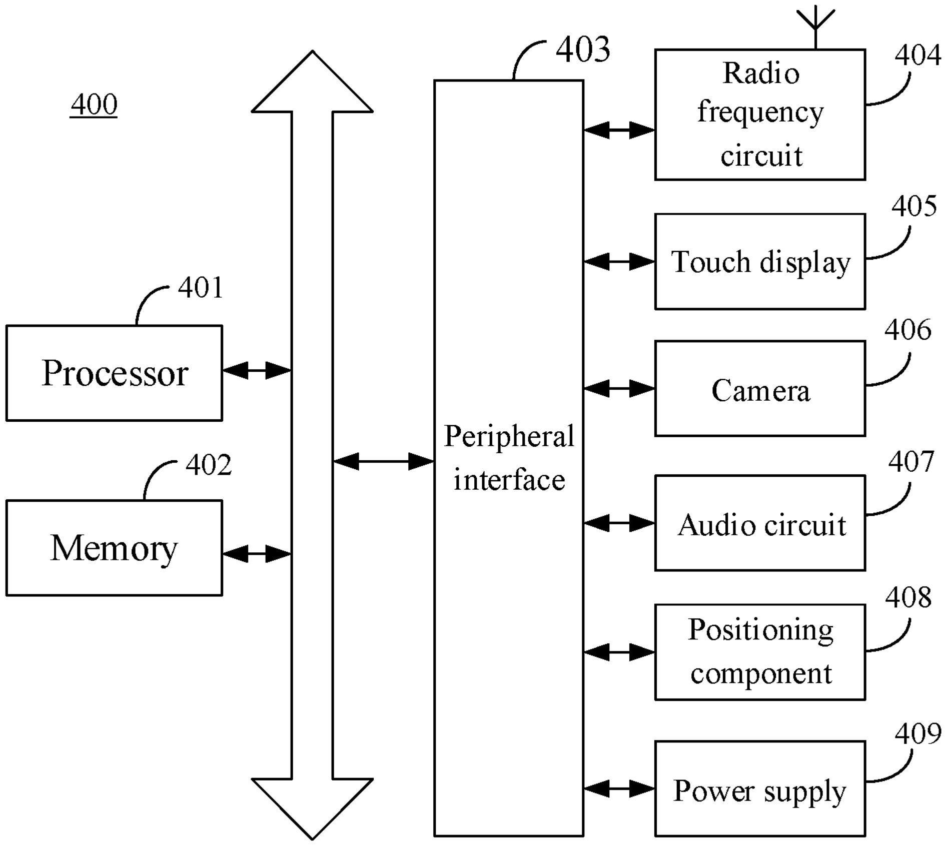
FIG. 16 is a structural block diagram of an apparatus for detecting intensities of ambient light according to some exemplary embodiments of the present disclosure.

FIG. 16 is a structural block diagram of an apparatus 400 for detecting intensities of ambient light according to some exemplary embodiments of the present disclosure. The apparatus is a smartphone, a tablet computer, a moving picture experts group audio layer III (MP3 player), a moving picture experts group audio layer IV (MP4 player), a notebook computer, or a desktop computer. The apparatus is also referred to as a user device, a portable terminal, a laptop terminal, a desktop terminal, and the like.

Typically, the apparatus includes a processor 401 and a memory 402.

The processor 401 includes one or more processing cores, such as a four-core processor, an eight-core processor, and the like. The processor 401 is implemented by employing at least one hardware form of a digital signal processor (DSP), a field-programmable gate array (FPGA), and a programmable logic array (PLA). The processor 401 includes a main processor and a co-processor. The main processor is a processor for processing data in an awakening state and is also referred to as a central processing unit (CPU). The co-processor is a low-power processor for processing data in a standby state. In some embodiments, the processor 401 is integrated with a graphics processing unit (GPU), and the GPU is responsible for rendering and drawing contents to be displayed on the display. In some embodiments, the processor 401 further includes an artificial intelligence (AI) processor, and the AI processor is configured to handle computation and operations related to machine learning.

The memory 402 includes one or more computer-readable storage media. The computer-readable storage medium is non-transitory. The memory 402 further includes a high-speed random access memory and a non-volatile memory, such as one or more disk storage devices and flash memory storage devices. In some embodiments, the non-transitory computer-readable storage medium in the memory 402 is configured to store at least one instruction. The at least one instruction, when loaded and executed by the processor 401, causes the processor to perform the method for detecting intensities of ambient light according to the method embodiments of the present disclosure.

In some embodiments, the apparatus for detecting intensities of ambient light optionally further includes a peripheral interface 403 and at least one peripheral device. The processor 401, the memory 402, and the peripheral interface 403 are connected to each other via a bus or a signal line. Each of the peripheral devices is connected to the peripheral interface 403 via the bus, the signal line, or a circuit board. Specifically, the peripheral device includes at least one of a radio frequency (RF) circuit 404, a touch display 405, a camera 406, an audio circuit 407, a positioning component 408, and a power supply 409.

The peripheral interface 403 is configured to connect at least one of the peripheral devices related to input/output (I/O) to the processor 401 and the memory 402. In some embodiments, the processor 401, the memory 402, and the peripheral interface 403 are integrated on a same chip or circuit board; in other embodiments, the processor 401, either or two of the processor 401, the memory 402, and the peripheral interface 403 may be implemented on a separate chip or circuit board, which are not limited herein.

The RF circuit 404 is configured to receive and transmit RF signals, which are also referred to as electromagnetic signals. The RF circuit 404 communicates with communication networks and other communication devices over the electromagnetic signals. The RF circuit 404 converts electrical signals into the electromagnetic signals for transmission or converts the received electromagnetic signals into the electrical signals. Optionally, the RF circuit 404 includes an antenna system, an RF transceiver, one or more amplifiers, a tuner, an oscillator, a digital signal processor, a coder-decoder chipset, a subscriber identity module card, and the like. The RF circuit 404 communicates with other terminals via at least one wireless communication protocol. The wireless communication protocols include, but are not limited to, metropolitan area networks, various generations of mobile communication networks (2G, 3G, 4G, and 5G), wireless local area networks, and/or wireless fidelity (Wi-Fi) networks. In some embodiments, the RF circuit 404 further includes a circuit related to a near-field communication (NFC), which is not limited herein.

The display 405 is configured to display a user interface (UI). The UI includes graphics, text, icons, videos, and any combination thereof. When the display 405 is the touch display, the display 405 further has the ability to capture a touch signal on or above a surface of the display 405. The touch signal is input to the processor 401 as a control signal for processing. At this point, display 405 is further configured to provide a virtual button and/or a virtual keyboard, also referred to as a soft button and/or a soft keyboard. In some embodiments, the display 405 is a front panel for deploying the apparatus for detecting intensities of ambient light; in other embodiments, the number of displays 405 is at least two, and each of the displays is arranged on a different surface of the apparatus for detecting intensities of ambient light or in a folded design; and in further embodiments, the display 405 is a flexible display arranged on a curved surface or a folded surface of the apparatus for detecting intensities of ambient light. Even more, the display 405 is arranged as a non-rectangular irregular shape, that is, a shaped screen. The display 405 is prepared using a liquid crystal display (LCD), an organic light-emitting diode (OLED), and the like.

The camera component is configured to capture images or videos. Optionally, the camera component 406 includes a front camera and a rear camera. Typically, the front camera is deployed on a front panel of a terminal, and the rear camera is deployed on a back of the terminal. In some embodiments, the number of rear cameras is at least two, the types of which are respectively any one of a main camera, a depth-of-field camera, a wide-angle camera, and a telephoto camera, such that a bokeh function is achieved by achieving a fusion of the main camera and the depth-of-field camera, and a panoramic shooting and a virtual reality (VR) shooting function, or other shooting functions are achieved by achieving a fusion of the main camera and the wide-angle camera. In some embodiments, the camera component 406 further includes a flash. The flash is a monochromatic temperature flash or a dual-color temperature flash. A dual-color temperature flash is a combination of a warm flash and a cool flash, which is employed for light compensation under different color temperatures.

The audio circuit 407 includes a microphone and a speaker. The microphone is configured to capture sound waves from the user and the environment, convert the sound waves into electrical signals, and input the electrical signals to the processor 401 for process or to the RF circuit 404 for voice communication. For stereo capture or noise reduction, the number of microphones is a plurality, the plurality of microphones are deployed on different parts of the apparatus for detecting intensities of ambient light. The microphone is an array microphone or an omnidirectional capture microphone. The speaker is configured to convert the electrical signals from the processor 401 or the RF circuit 404 into the sound waves. The speaker is a conventional thin-film speaker or a piezoelectric ceramic speaker. When the speaker is the piezoelectric ceramic speaker, the speaker is capable of converting the electrical signals into sound waves that are audible to humans and sound waves that are inaudible to humans for distance measurement. In some embodiments, the audio circuit 407 further includes a headset jack.

The positioning component 408 is configured to locate a current geographic location of apparatus for detecting intensities of ambient light for implementing a navigation or location based service (LBS). The positioning component 408 is a location component based on the global positioning system (GPS) of the United States, the BeiDou system of China, the Glonass of Russia, or the Galileo of the European Union.

The power supply 409 is configured to power various components in the apparatus for detecting intensities of ambient light. The power supply 409 is an AC power, a DC power, a disposable battery, or a rechargeable battery. When the power supply 409 includes the rechargeable battery, the rechargeable battery supports wired charging or wireless charging. The rechargeable battery also supports quick-acting charging technology.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising: an array substrate, a functional device layer, and a color filter layer, wherein the array substrate comprises a display region and a peripheral region surrounding the display region, the functional device layer is disposed on a bearing surface of the array substrate, and the functional device layer comprises a first photosensitive device, a second photosensitive device, a plurality of light-emitting devices, and a color temperature sensor; wherein the first photosensitive device is configured to detect light, emitted by the light-emitting device, reflected by a finger, and comprises a first photosensitive layer, a first electrode, and a second electrode, the first electrode and the second electrode being respectively disposed on two opposite surfaces of the first photosensitive layer, and the first electrode being disposed on a surface, proximal to the array substrate, of the first photosensitive layer;

the second photosensitive device is configured to detect an intensity of ambient light and comprises a second photosensitive layer, a third electrode, and a fourth electrode, the second photosensitive layer and the first photosensitive layer being disposed in a same layer, the third electrode and the first electrode being disposed in a same layer, and the fourth electrode and the second electrode being disposed in a same layer;

the color temperature sensor is arranged close to the second photosensitive device, the second photosensitive device and the color temperature sensor are disposed in the peripheral region, and the peripheral region is provided with a frame, wherein the frame corresponding to the second photosensitive device and the color temperature sensor is provided with a light-transmitting region;

the color filter layer is disposed on a surface, distal from the array substrate, of the functional device layer, and comprises a plurality of color blocks and a light-shielding structure disposed between the plurality of color blocks, wherein the light-emitting device is opposite to the color block, and the light-shielding layer comprises a fingerprint hole and an ambient light hole, the fingerprint hole being opposite to the first photosensitive layer, and the ambient light hole being opposite to the second photosensitive layer;

wherein a center of one of the color blocks closest to the ambient light hole lies in a reference plane, and the ambient light hole and the one of the color blocks closest to the ambient light hole satisfy a relationship as follows:

in the case that a width of the ambient light hole is greater than a width of the second photosensitive layer, tan $\alpha=(P-d)/h$, and tan $\beta=(P+d)/h$; and in the case that the width of the ambient light hole is not greater than the width of the second photosensitive layer, tan $\alpha=(P-D)/h$, and tan $\beta=(P+D)/h$;

wherein P represents a distance, in a direction parallel to the bearing surface of the array substrate, between the center of the ambient light hole and a center of the one of the color blocks closest to the ambient light hole, d represents the width of the ambient light hole, D represents the width of the second photosensitive layer, and h represents a distance, in a direction perpendicular to the bearing surface of the array substrate, between the color block and the second photosensitive layer, and $0<\alpha<\beta\leq 42°$.

2. The display panel according to claim 1, wherein the light-emitting device comprises an anode, a light-emitting layer, and a cathode, wherein the anode and the cathode are respectively disposed on two opposite surfaces of the light-emitting layer, and the anode is disposed on a surface, proximal to the array substrate, of the light-emitting layer, the anode and the second electrode being disposed in a same layer.

3. The display panel according to claim 1, wherein a ratio of a width of the ambient light hole to a width of the second photosensitive layer ranges from 0.5 to 1.5, and both a width direction of the ambient light hole and a width direction of the second photosensitive layer are parallel to the bearing surface of the array substrate and lie in a reference plane, the reference plane being a surface that is perpendicular to the bearing surface of the substrate and runs through a center of the ambient light hole.

4. The display panel according to claim 1, wherein the color temperature sensor comprises a third photosensitive device, a fourth photosensitive device, and a fifth photosensitive device;

wherein the third photosensitive device, the fourth photosensitive device, and the fifth photosensitive device are respectively opposite to the color blocks of different colors.

5. The display panel according to claim 4, wherein the third photosensitive device comprises a third photosensitive layer, a fifth electrode, and a sixth electrode;

the fourth photosensitive device comprises a fourth photosensitive layer, a seventh electrode, and an eighth electrode; and the fifth photosensitive device comprises a fifth photosensitive layer, a ninth electrode, and a tenth electrode; wherein the third photosensitive layer, the fourth photosensitive layer, the fifth photosensitive layer, and the first photosensitive layer are disposed in a same layer;

the fifth electrode, the sixth electrode, the seventh electrode, and the first electrode are disposed in a same layer; and the sixth electrode, the eighth electrode, the tenth electrode, and the second electrode are disposed in a same layer.

6. The display panel according to claim 4, wherein the light-emitting device and the first photosensitive device are disposed in the display region.

7. The display panel according to claim 4, wherein the functional device layer further comprises a transparent protective layer; wherein the transparent protective layer is disposed on surfaces, distal from the array substrate, of the first photosensitive layer, the second photosensitive layer, the third photosensitive layer, the fourth photosensitive layer, and the fifth photosensitive layer; and the transparent protective layer comprises a plurality of vias, the second electrode, the fourth electrode, the sixth electrode, and the eighth electrode being respectively connected to the first photosensitive layer, the second photosensitive layer, the third photosensitive layer, the fourth photosensitive layer, and the fifth photosensitive layer by the vias.

8. A display device, comprising a display panel;

wherein the display panel comprises: an array substrate, a functional device layer, and a color filter layer, wherein the array substrate comprises a display region and a peripheral region surrounding the display region, the functional device layer is disposed on a bearing surface of the array substrate, and the functional device layer comprises a first photosensitive device, a second photosensitive device, a plurality of light-emitting devices, and a color temperature sensor; wherein the first photosensitive device is configured to detect light, emitted by the light-emitting device, reflected by a finger, and comprises a first photosensitive layer, a first electrode, and a second electrode, the first electrode and the second electrode being respectively disposed on two opposite surfaces of the first photosensitive layer, and the first electrode being disposed on a surface, proximal to the array substrate, of the first photosensitive layer;

the second photosensitive device is configured to detect an intensity of ambient light and comprises a second photosensitive layer, a third electrode, and a fourth electrode, the second photosensitive layer and the first photosensitive layer being disposed in a same layer, the third electrode and the first electrode being disposed in a same layer, and the fourth electrode and the second electrode being disposed in a same layer;

the color temperature sensor is arranged close to the second photosensitive device, the second photosensitive device and the color temperature sensor are disposed in the peripheral region, and the peripheral region is provided with a frame, wherein the frame corresponding to the second photosensitive device and the color temperature sensor is provided with a light-transmitting region;

the color filter layer is disposed on a surface, distal from the array substrate, of the functional device layer, and comprises a plurality of color blocks and a light-shielding structure disposed between the plurality of color blocks, wherein the light-emitting device is opposite to the color block, and the light-shielding layer comprises a fingerprint hole and an ambient light hole, the fingerprint hole being opposite to the first photosensitive layer, and the ambient light hole being opposite to the second photosensitive layer;

wherein a center of one of the color blocks closest to the ambient light hole lies in a reference plane, and the ambient light hole and the one of the color blocks closest to the ambient light hole satisfy a relationship as follows:

in the case that a width of the ambient light hole is greater than a width of the second photosensitive layer, $\tan\alpha=(P-d)/h$, and $\tan\beta=(P+d)/h$; and in the case that the width of the ambient light hole is not greater than the width of the second photosensitive layer, $\tan\alpha=(P-D)/h$, and $\tan\beta=(P+D)/h$;

wherein P represents a distance, in a direction parallel to the bearing surface of the array substrate, between the center of the ambient light hole and a center of the one of the color blocks closest to the ambient light hole, d represents the width of the ambient light hole, D represents the width of the second photosensitive layer, and h represents a distance, in a direction perpendicular to the bearing surface of the array substrate, between the color block and the second photosensitive layer, and $0<\alpha<\beta\leq 42°$.

9. The display device according to claim 8, wherein the light-emitting device comprises an anode, a light-emitting layer, and a cathode, wherein the anode and the cathode are respectively disposed on two opposite surfaces of the light-emitting layer, and the anode is disposed on a surface, proximal to the array substrate, of the light-emitting layer, the anode and the second electrode being disposed in a same layer.

10. The display device according to claim 8, wherein a ratio of a width of the ambient light hole to a width of the second photosensitive layer ranges from 0.5 to 1.5, and both a width direction of the ambient light hole and a width direction of the second photosensitive layer are parallel to the bearing surface of the array substrate and lie in a reference plane, the reference plane being a surface that is perpendicular to the bearing surface of the substrate and runs through a center of the ambient light hole.

11. The display device according to claim 8, wherein the color temperature sensor comprises a third photosensitive device, a fourth photosensitive device, and a fifth photosensitive device;

wherein the third photosensitive device, the fourth photosensitive device, and the fifth photosensitive device are respectively opposite to the color blocks of different colors.

12. The display device according to claim 11, wherein the third photosensitive device comprises a third photosensitive layer, a fifth electrode, and a sixth electrode;

the fourth photosensitive device comprises a fourth photosensitive layer, a seventh electrode, and an eighth electrode; and the fifth photosensitive device comprises a fifth photosensitive layer, a ninth electrode, and a tenth electrode; wherein the third photosensitive layer, the fourth photosensitive layer, the fifth photosensitive layer, and the first photosensitive layer are disposed in a same layer;

the fifth electrode, the sixth electrode, the seventh electrode, and the first electrode are disposed in a same layer; and the sixth electrode, the eighth electrode, the tenth electrode, and the second electrode are disposed in a same layer.

13. The display device according to claim 11, wherein the light-emitting device and the first photosensitive device are disposed in the display region.

14. The display device according to claim 11, wherein the functional device layer further comprises a transparent protective layer; wherein the transparent protective layer is disposed on surfaces, distal from the array substrate, of the first photosensitive layer, the second photosensitive layer, the third photosensitive layer, the fourth photosensitive layer, and the fifth photosensitive layer; and the transparent protective layer comprises a plurality of vias, the second electrode, the fourth electrode, the sixth electrode, and the eighth electrode being respectively connected to the first photosensitive layer, the second photosensitive layer, the third photosensitive layer, the fourth photosensitive layer, and the fifth photosensitive layer by the vias.

* * * * *